(12) United States Patent
Jung

(10) Patent No.: US 7,081,396 B2
(45) Date of Patent: Jul. 25, 2006

(54) METHOD FOR MANUFACTURING DEVICE ISOLATION FILM OF SEMICONDUCTOR DEVICE

(75) Inventor: Jong Goo Jung, Suwon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 219 days.

(21) Appl. No.: 10/742,771

(22) Filed: Dec. 23, 2003

(65) Prior Publication Data

US 2005/0054176 A1    Mar. 10, 2005

(30) Foreign Application Priority Data

Sep. 5, 2003    (KR)    .................. 10-2003-0062054

(51) Int. Cl.
*H01L 21/76*    (2006.01)

(52) U.S. Cl. .................. 438/424; 438/435; 438/437; 438/778

(58) Field of Classification Search ................ 438/424, 438/435, 778
See application file for complete search history.

(56) References Cited

U.S. PATENT DOCUMENTS

| | | | |
|---|---|---|---|
| 6,555,442 B1 * | 4/2003 | Pai et al. ................. | 438/424 |
| 2002/0127818 A1 * | 9/2002 | Lee et al. ................. | 438/424 |
| 2002/0197823 A1 * | 12/2002 | Yoo et al. ................. | 438/424 |
| 2003/0038334 A1 * | 2/2003 | Kim et al. ................. | 257/499 |
| 2004/0262641 A1 * | 12/2004 | Rhodes ...................... | 257/202 |

* cited by examiner

*Primary Examiner*—W. David Coleman
*Assistant Examiner*—Khiem Nguyen
(74) *Attorney, Agent, or Firm*—Heller Ehrman LLP

(57) ABSTRACT

The present invention discloses method for manufacturing device isolation film wherein a high selectivity slurry containing $M_xP_yO_z$ is used for polishing nitride film to prevent the generation of moat. In accordance with the method, a pad oxide film and a pad nitride film formed on a semiconductor substrate and the semiconductor substrate are etched to form a trench. A liner nitride film and an oxide film for device isolation film filling the trench are formed on the entire surface. The oxide film for device isolation film is first etched using a low selectivity slurry, and further etched using a high selectivity slurry to expose the liner nitride film. The liner nitride film is polished using a high selectivity slurry containing $M_xP_yO_z$ and the pad nitride film is then removed.

15 Claims, 7 Drawing Sheets

METHOD FOR MANUFACTURING DEVICE ISOLATION FILM OF SEMICONDUCTOR DEVICE

BACKGROUND OF THE INVENTION

1. Field of the Invention

The present invention relates to method for manufacturing device isolation film of semiconductor device, and in particular to an improved method for manufacturing device isolation film wherein a high selectivity slurry containing $M_xP_yO_z$ is used for polishing nitride film to prevent the generation of moat, thereby improving the characteristic of the device.

2. Description of the Background Art

FIGS. 1a through 1f are cross-sectional diagrams illustrating a conventional method for manufacturing device isolation film of semiconductor device.

Referring to FIG. 1a, a pad oxide film 20 and a pad nitride film 30 are sequentially formed on a semiconductor substrate 10.

Referring to FIG. 1b, the pad nitride film 30, the pad oxide film 20 and the semiconductor substrate 10 are etched to form a trench 40.

Referring to FIG. 1c, an oxide film 50 is formed on the inner surface of the trench. Thereafter, a liner nitride film 60 is formed on the entire surface including the inner surface of the trench 40.

Referring to FIG. 1d, an oxide film for device isolation film 70 filling the trench 40 is formed on the entire surface.

Referring to FIGS. 1e and 1f, the oxide film for device isolation film 70 is polished until liner nitride film 60 is exposed. The liner nitride film 40 and the pad nitride film 30 are then removed to form a device isolation film 80.

In accordance with the conventional method for manufacturing device isolation film of semiconductor device, a moat denoted as "a" in FIG. 1f is generated during the etching processes of the liner nitride film and the pad nitride film and a subsequent cleaning process. Residues are accumulated in the moat, which degrades the characteristic of the device.

SUMMARY OF THE INVENTION

Accordingly, it is an object of the present invention to provide a method for manufacturing device isolation film of semiconductor device wherein a high selectivity slurry containing $M_xP_yO_z$ is used for polishing nitride film to prevent the generation of moat and to improve the overall characteristics of the device.

In order to achieve the above-described object of the invention, there is provided a method for manufacturing device isolation film of semiconductor device, the method comprising the steps of: sequentially forming a pad oxide film and a pad nitride film on a semiconductor substrate; forming a trench by etching the pad nitride film, the pad oxide film and the semiconductor substrate; forming a liner nitride film on the entire surface; forming an oxide film for device isolation film filling the trench on the entire surface; polishing a predetermined thickness of the oxide film for device isolation film using a low selectivity slurry; polishing the oxide film for device isolation film using a high selectivity slurry to expose the liner nitride film; polishing the liner nitride film using a high selectivity slurry containing $M_xP_yO_z$ to expose the pad nitride film; and removing the pad nitride. (where M is selected from a group consisting of an alkaline metal, an alkaline earth metal, hydro alkaline metal, hydro alkaline earth metal, hydrogen and $NH_4^+$, and where x, y and z are natural numbers in the range of $0 \leq x \leq 3$, $1 \leq y \leq 3$ and $2 \leq z \leq 5$)

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing device isolation film of semiconductor device in accordance with a preferred embodiment of the present invention will now be described in detail with reference to the accompanying drawings.

FIGS. 2a through 2h are cross-sectional diagrams illustrating a method for manufacturing device isolation film of semiconductor device in accordance with the present invention.

Figure 1A:
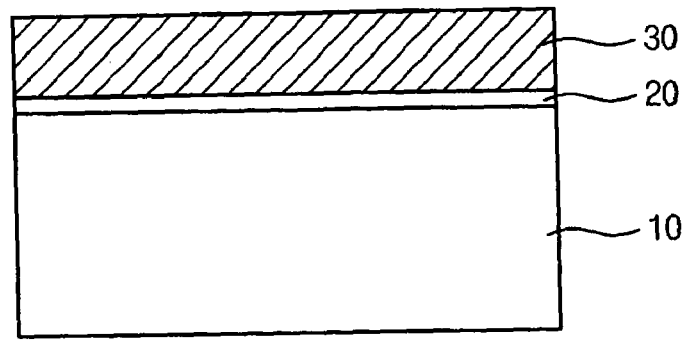
FIGS. 1a through 1f are cross-sectional diagrams illustrating a conventional method for manufacturing device isolation film of semiconductor device.
Figure 1B:
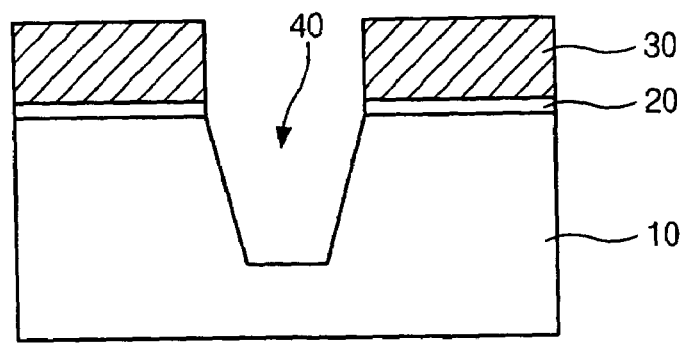
Figure 1C:
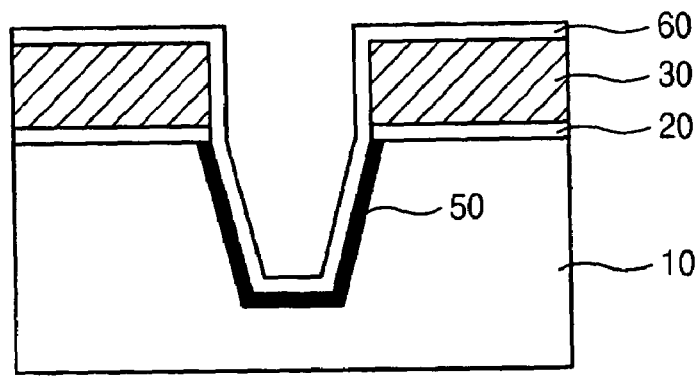
Figure 1D:
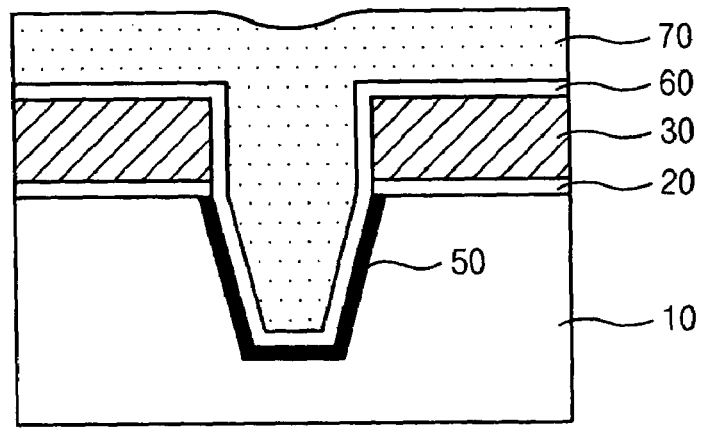
Figure 1E:
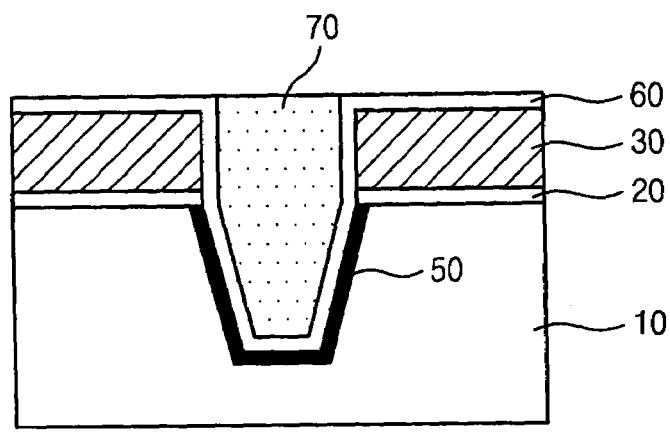
Figure 1F:
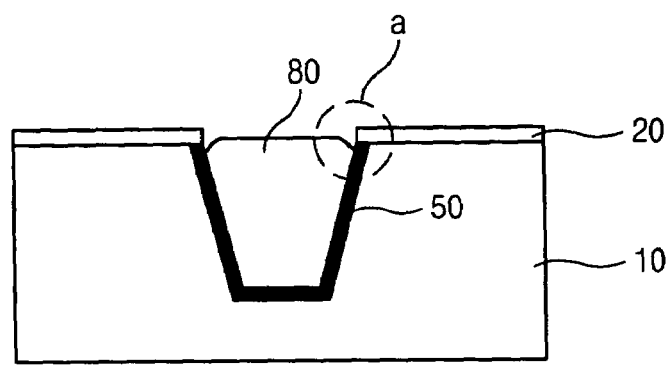
Figure 2A:
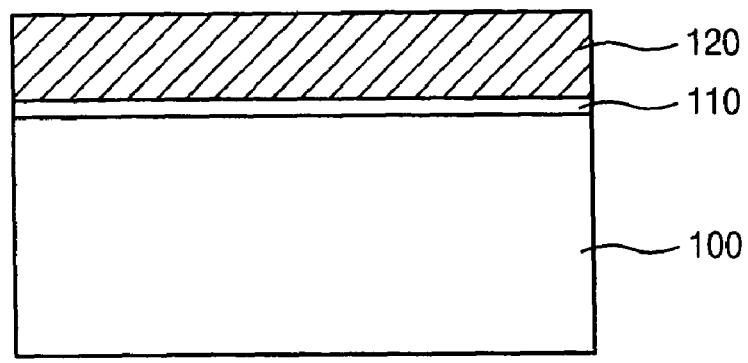
FIGS. 2a through 2h are cross-sectional diagrams illustrating a method for manufacturing device isolation film of semiconductor device in accordance with the present invention.

Referring to FIG. 2a, a pad oxide film 110 and a pad nitride film 120 are sequentially formed on a semiconductor substrate 100. Preferably, the pad oxide film 110 is formed via a wet or a dry oxidation process and has a thickness ranging from 10 to 200 Å.

Figure 2B:
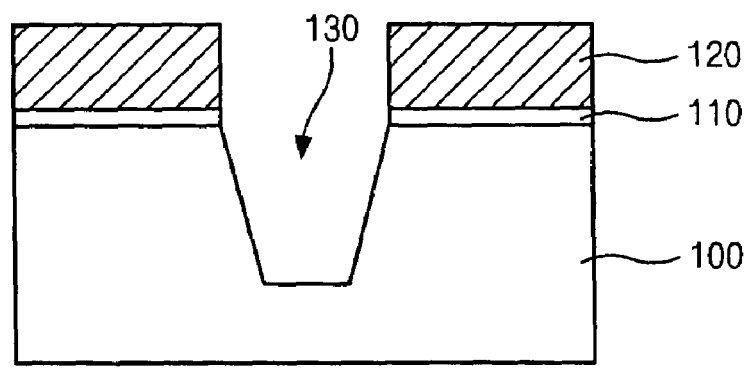

Referring to FIG. 2b, the pad nitride film 120, the pad oxide film 110 and the semiconductor substrate 100 are etched to form a trench 130. The depth of the trench 130 ranges from 1500 to 3000 Å.

Figure 2C:
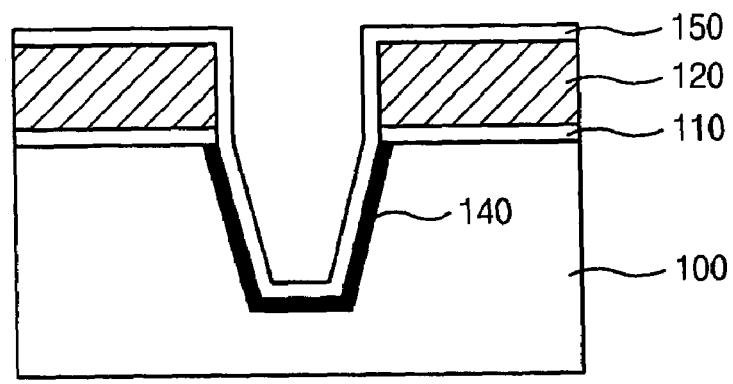

Referring to FIG. 2c, an oxide film 140 is formed on the inner surface of the trench 130 to compensate for the damages that was done during the etching process of the trench 130. The formation process of the oxide film 140 is an optional process. Thereafter, a liner nitride film 150 is formed on the entire surface including the inner surface of the trench 130 to improve the refresh characteristics of the device. Preferably, the liner nitride film 150 is formed via an LPCVD process using $SiH_2Cl_2$ and $NH_3$ as a source gas or via a PECVD process using $SiH_4$ and $NH_3$ a source gas. In one embodiment, a liner oxide film (not shown) may be formed on the liner nitride film 150 and then thermally treated to reduce a stress on the device isolation film formed in subsequent process. Preferably, the liner oxide film is formed via a wet or a dry oxidation process and has a thickness ranging from 10 to 200 Å.

Figure 2D:
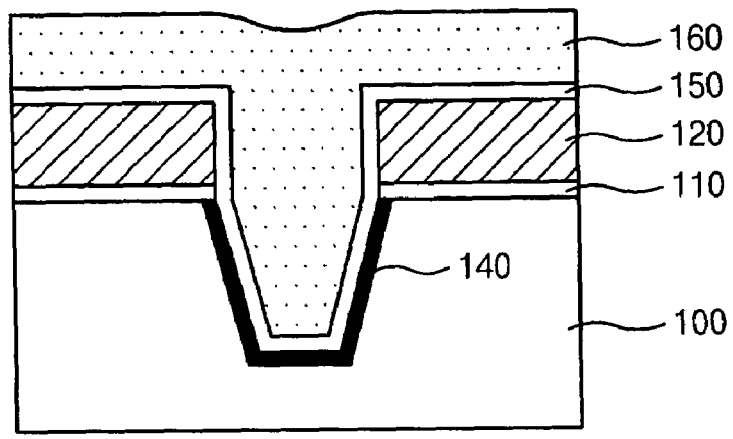

Referring to FIG. 2d, an oxide film 160 for device isolation film filling the trench 130 is then formed on the entire surface. In one embodiment, the oxide film 160 comprises a HDP (High Density Plasma) oxide film having a thickness ranging from 3000 to 10000 Å. In another embodiment, the oxide film 160 comprises an APL (Advanced Planarization Layer) formed via an LPCVD process using $SiH_4$ and $H_2O_2$ as a source gas. In another embodiment, the oxide film 160 comprises a stacked structure of an APL having a thickness ranging from 100 to 1000 Å formed via an LPCVD process using $SiH_4$ and $H_2O_2$ as a source gas and a HDP oxide film having a thickness ranging from 2000 to 9000 Å.

Figure 2E:
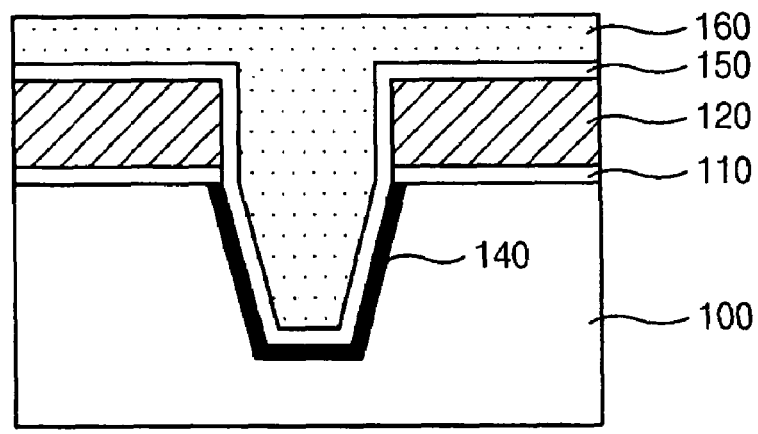

Referring to FIG. 2e, a predetermined thickness of the oxide film 160 is polished using a low selectivity slurry.

Figure 2F:
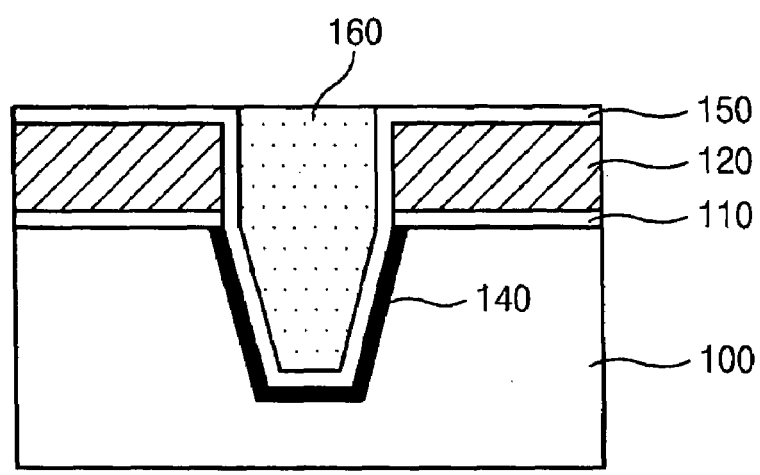

Referring to FIG. 2f, the remaining portion of the oxide film 160 is polished using a high selectivity slurry until the liner nitride film 150 is exposed.

Figure 2G:
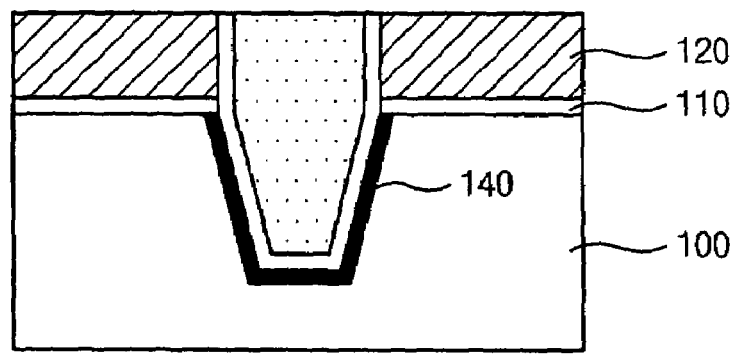

Referring to FIG. 2g, the liner nitride film 150 is polished using a high selectivity slurry containing $M_xP_yO_z$ until the pad nitride film 120 is exposed. M is an alkaline metal such as $Na^+$ and $K^+$, an alkaline earth metal such as $Mg^{2+}$ or $Ca^{2+}$, hydro alkaline metal, hydro alkaline earth metal, hydrogen or $NH_4^+$ and x, y and z are natural numbers in the range of $0 \leq x \leq 3$, $1 \leq y \leq 3$ and $2 \leq z \leq 5$. Specifically, $M_xP_yO_z$ comprises $H_3PO_4$ and its salts such as $(NH_4)_3PO_4$, $Na_3PO_4$ and $Na(H_2)PO_4$ as well as $HPO_3$, $H_3PO_2$ and $H_3PO_3$.

The high selectivity slurry containing $M_xP_yO_z$ may be manufactured by mixing a high selectivity slurry supplied through a line for supplying high selectivity slurry and $M_xP_yO_z$ supplied through a line for supplying $M_xP_yO_z$. Preferably, the ratio of $M_xP_yO_z$ in the high selectivity slurry containing $M_xP_yO_z$ ranges from 0.1 to 30 wt %. In one embodiment, the high selectivity slurry containing $M_xP_yO_z$ comprises an abrasive having a grain size ranging from 50 to 300 nm selected from the group consisting of silica, ceria, zirconia, alumina and combinations thereof. Preferably the pH of the high selectivity slurry containing $M_xP_yO_z$ is less than 8 so that the high selectivity slurry containing $M_xP_yO_z$ is neutral or acidic.

Figure 2H:
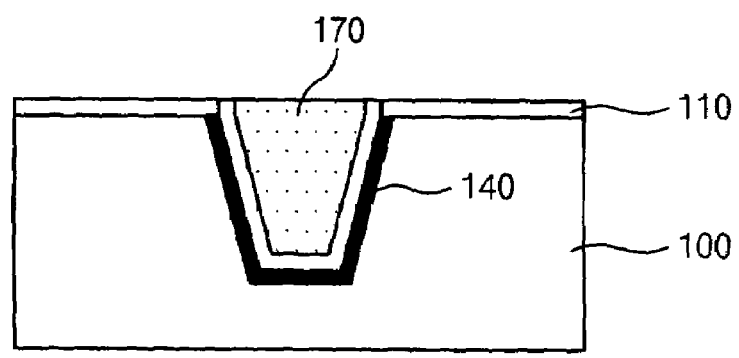

Referring to FIG. 2h, the exposed portion of the pad nitride film 120 is removed preferably using phosphoric acid solution. The process of polishing the liner nitride film 150 and the process of removing the pad nitride film 120 may be performed in separate platens.

As discussed earlier, in accordance with the present invention, a high selectivity slurry containing $M_xP_yO_z$ is used for polishing nitride film to prevent the generation of moat. When moat is not generated, residues are not accumulated in the moat and overall characteristics of the device are improved.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing device isolation film of semiconductor device, the method comprising the steps of:
   sequentially farming a pad oxide film and a pad nitride film on a semiconductor substrate;
   forming a trench by etching the pad nitride film, the pad oxide film and the semiconductor substrate;
   forming a liner nitride film on the entire surface;
   forming an oxide film for device isolation film filling the trench on the entire surface;
   polishing a predetermined thickness of the oxide film for device isolation film using a low selectivity slurry;
   polishing the oxide film for device isolation film using a high selectivity slurry to expose the liner nitride film;
   polishing the liner nitride film using a high selectivity slurry containing $M_xP_yO_z$ to expose the pad nitride film, where M is selected from a group consisting of an alkaline metal, an alkaline earth metal, a hydro alkaline metal, hydro alkaline earth metal, hydrogen and $NH_4^+$, where x, y and z are natural numbers in the range of $0 \leq x \leq 3.1$ $\leq y \leq 3$ and $2 \leq z \leq 5$; and
   removing the pad nitride film.

2. The method according to claim 1, wherein the step of forming a trench further comprises forming an oxide film on a inner surface of the trench.

3. The method according to claim 1, wherein the step of forming a liner nitride film comprises an LPCVD process using $SiH_2Cl_2$ and $NH_3$ as a source gas or a PECVD process using $SiH_4$ and $NH_3$ as a source gas.

4. The method according to claim 1, wherein the step of forming a liner nitride film further comprises forming a liner oxide film on the liner nitride film and thermally treating the liner oxide film.

5. The method according to claim 1, wherein the oxide film for device isolation film comprises a HDP oxide film.

6. The method according to claim 1, wherein the step of removing the pad nitride film is performed using a phosphoric acid solution.

7. The method according to claim 1, wherein $M_xP_yO_z$ is $H_3PO_4$ or $NaH_2PO_2$.

8. The method according to claim 1, wherein $M_xP_yO_z$ is metal selected from the group consisting of alkaline metals, and alkaline earth metals.

9. The method according to claim 8, wherein one of the alkaline metals is $Na^+$ or $K^+$.

10. The method according to claim 8, wherein one of the alkaline metals is $Mg^+$ or $Ca^+$.

11. The method according to claim 1, wherein the high selectivity slurry containing $M_xP_yO_z$ may be manufactured by mixing a high selectivity slurry supplied through a line for supplying high selectivity slurry and $M_xP_yO_z$ supplied through a line for supplying $M_xP_yO_z$.

12. The method according to claim 1, wherein the steps of polishing the liner nitride film and removing the pad nitride film are performed in separate platens.

13. The method according to claim 1, wherein the ratio of $M_xP_yO_z$ in the high selectivity slurry containing $M_xP_yO_z$ ranges from 0.1 to 30 wt %.

14. The method according to claim 1, wherein the high selectivity slurry containing $M_xP_yO_z$ comprises an abrasive having a grain size ranging from 50 to 300 nm selected from the group consisting of silica, ceria, zirconia, alumina and combinations thereof.

15. The method according to claim 1, wherein the pH of the high selectivity slurry containing $M_xP_yO_z$ is less than 8.

\* \* \* \* \*